United States Patent [19]
Krueger

[11] Patent Number: 5,391,035
[45] Date of Patent: Feb. 21, 1995

[54] MICRO-ENVIROMENT LOAD LOCK
[75] Inventor: Gordon P. Krueger, San Jose, Calif.
[73] Assignee: Applied Materials, Inc., Santa Clara, Calif.
[21] Appl. No.: 229,071
[22] Filed: Apr. 18, 1994

Related U.S. Application Data

[63] Continuation of Ser. No. 973,112, Nov. 6, 1992, abandoned.

[51] Int. Cl.⁶ .............................................. B65B 21/02
[52] U.S. Cl. .................................... 414/217; 414/331; 414/411; 414/416; 414/437; 414/439; 414/940
[58] Field of Search .......... 414/786, DIG. 6, DIG. 5, 414/DIG. 3, 331, 416, 411, 422, 287, 217, 222, 940, 939, 937

[56] References Cited

U.S. PATENT DOCUMENTS

| | | | |
|---|---|---|---|
| 4,532,970 | 8/1985 | Tullis et al. | 414/DIG. 6 X |
| 4,534,389 | 8/1985 | Tullis | 414/DIG. 6 X |
| 4,582,219 | 4/1986 | Mortensen et al. | 220/326 |
| 4,632,624 | 12/1986 | Mirkovich et al. | 414/217 |
| 4,668,478 | 5/1987 | Homer et al. | 414/217 X |
| 4,705,444 | 11/1987 | Tullis et al. | 414/217 X |
| 4,709,834 | 12/1987 | Mortensen et al. | 220/326 |
| 4,746,256 | 5/1988 | Boyle et al. | 414/217 |
| 4,826,360 | 5/1989 | Iwasawa et al. | 414/217 X |
| 4,990,047 | 2/1991 | Wagner et al. | 414/DIG. 6 X |
| 4,995,430 | 2/1991 | Bonora et al. | 414/217 X |
| 5,044,871 | 9/1991 | Davis et al. | 414/217 X |
| 5,058,526 | 10/1991 | Matsushita et al. | 414/DIG. 6 X |
| 5,092,728 | 3/1992 | Crabb et al. | 414/331 X |
| 5,112,277 | 5/1992 | Cruz et al. | 414/217 X |
| 5,169,272 | 12/1992 | Bonora et al. | 414/217 |

FOREIGN PATENT DOCUMENTS 0238751 11/1986 European Pat. Off. .
0358443 9/1989 European Pat. Off. .
9207759 9/1991 WIPO .

Primary Examiner—Cheryl L. Gastineau
Attorney, Agent, or Firm—Michael A. Glenn; Peter J. Sgarbossa

[57] ABSTRACT

A micro-environment load lock for coupling a SMIF-type box containing a stack of semiconductor wafers directly to a wafer processing chamber includes a load lock chamber in communication with at least one wafer processing tool. The load lock also includes a seal operable to accept and sealably couple a SMIF-type box to the load lock chamber such that SMIF-type box becomes an extension of the load lock chamber, and provides a base that is selectably operable to open and close the SMIF-type box and to selectably draw a cassette of wafers from the SMIF-type box through a port in communication with the load lock chamber and into the load lock chamber. The base is also operable to seal the port in the absence of a SMIF-type box. A single robot is provided in conjunction with the load lock chamber for moving one wafer at a time between the cassette of wafers and the process chamber.

4 Claims, 2 Drawing Sheets

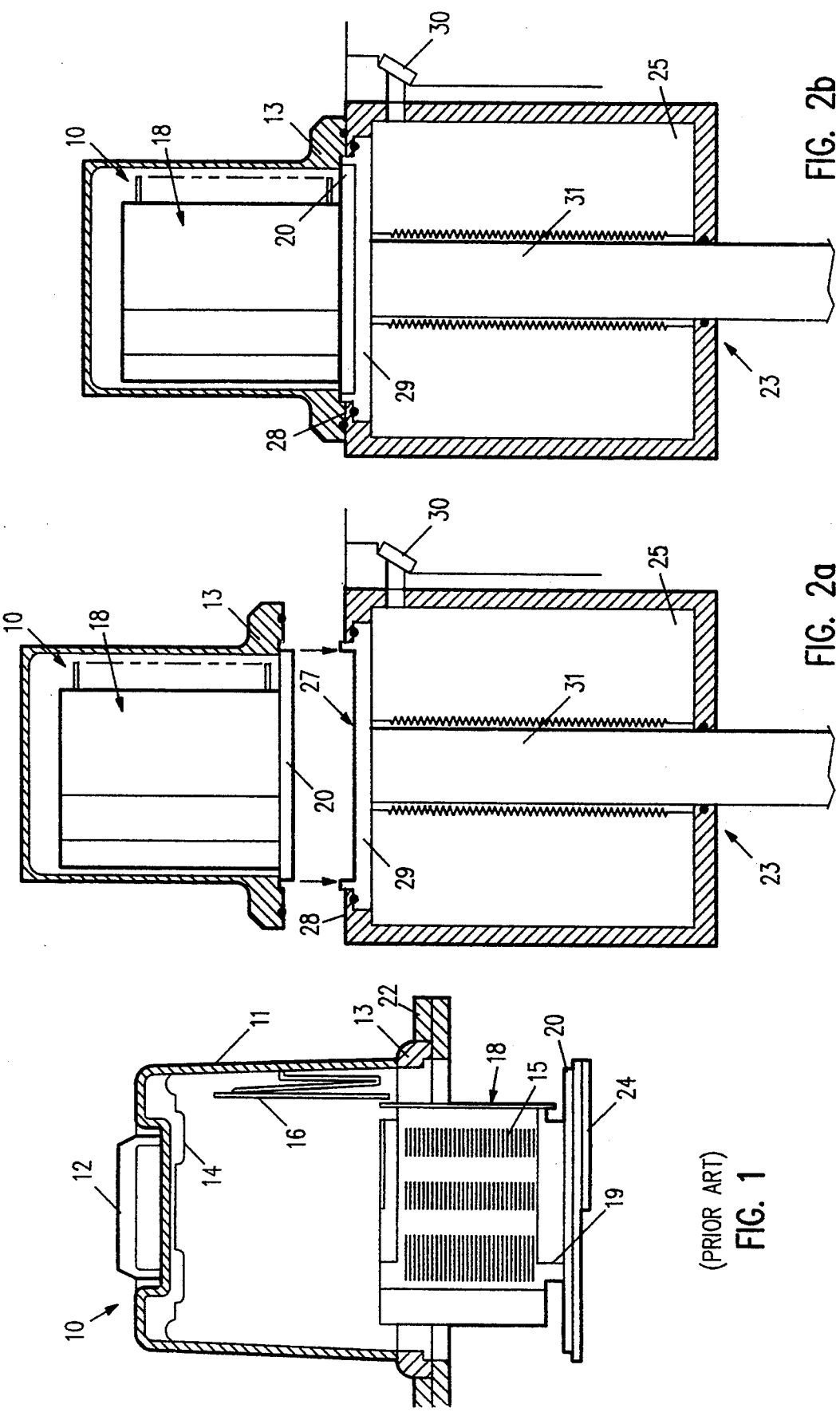

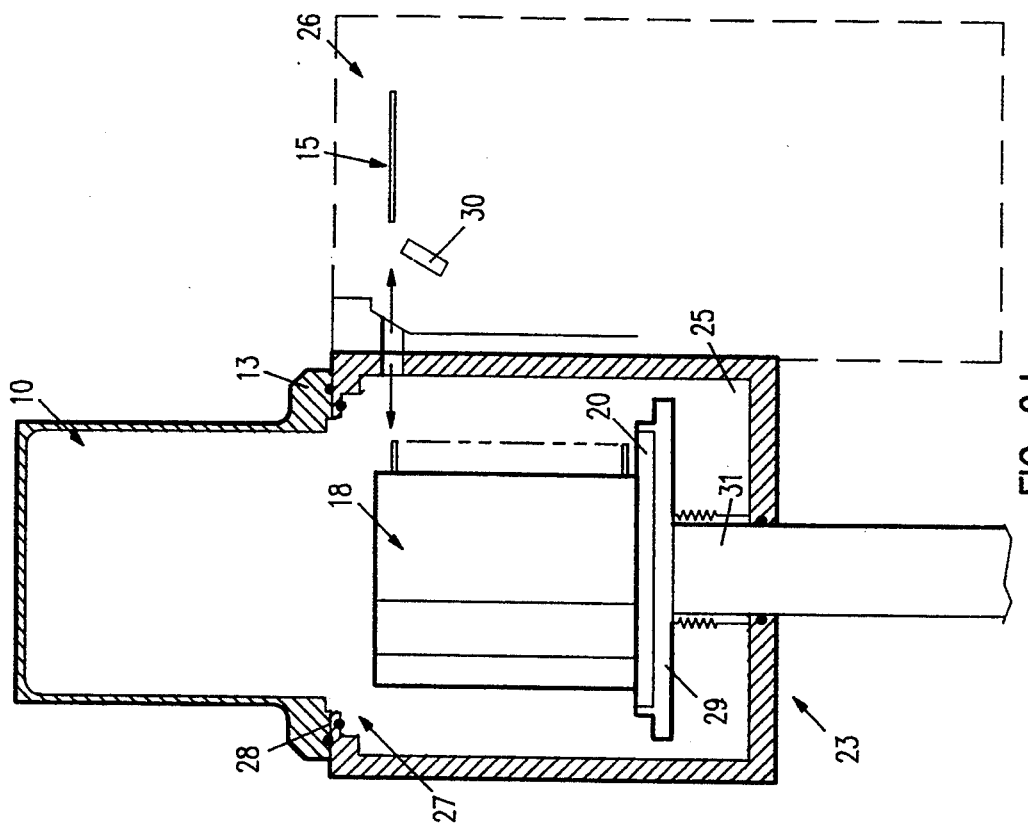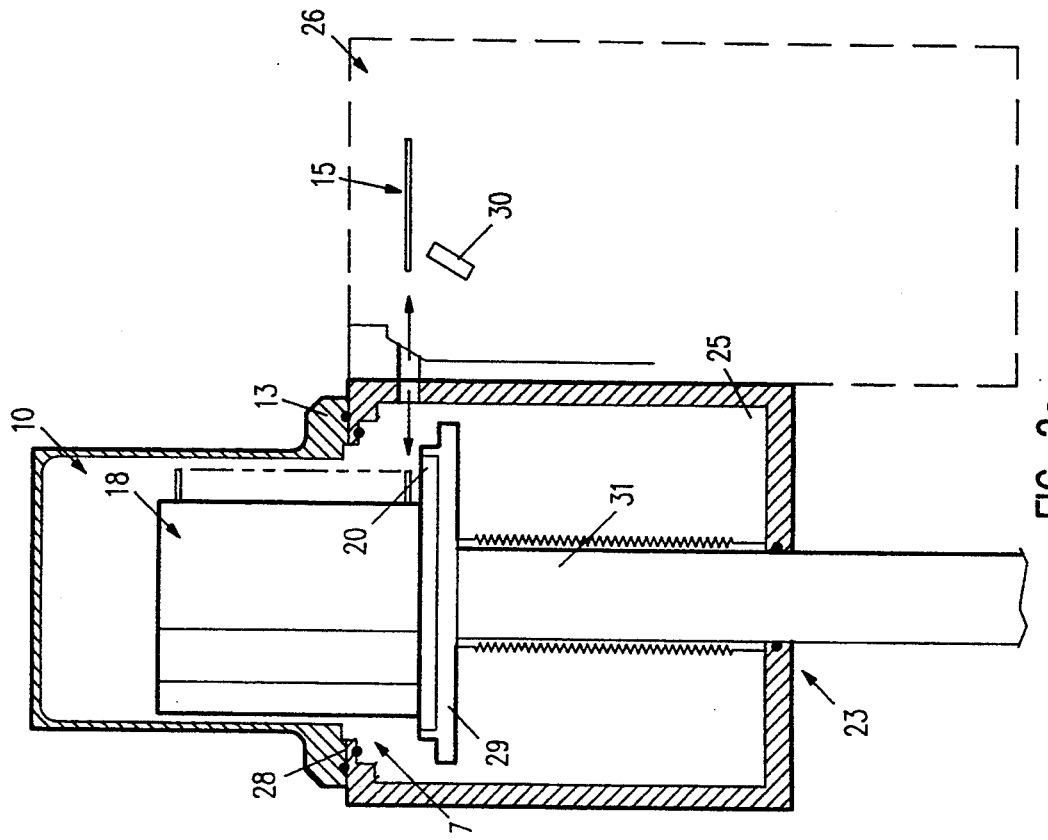

MICRO-ENVIROMENT LOAD LOCK

This is a continuation of application Ser. No. 07/973,112, filed Nov. 6, 1992, abandoned.

BACKGROUND OF THE INVENTION

1. Technical Field

The present invention relates to the handling of precision workpieces, such as semiconductor wafers. More particularly, the present invention relates to the transfer of semiconductor wafers between a sealed container and a sealed processing environment.

2. Description of the Prior Art

State of the art semiconductor fabrication processes require a highly refined and expensive clean room environment to prevent foreign body contamination of the semiconductor wafers on which devices are formed. As device geometry having features of less than 0.5 $\mu$m become prevalent, a clean room environment of less than class 1, i.e. an environment having less than one contaminant particle which is less than or equal to 0.5 $\mu$m per 0.3 m$^3$ (ft$^3$) of clean room volume, is generally required. Class 1 conditions additionally require that processed or partially processed wafers must be bagged when transported to subsequent processing facilities or to outside analysis or other systems.

Micro-environments, such as are provided by the standard mechanical interface (SMIF) box of the type manufactured by Asyst Technologies, Inc. of Milpitas, Calif., are an attractive alternative to the expense, excessive handling, and exposure to contaminant particles attendant with the bagging of semiconductor wafers for transport. In the SMIF-type box, semiconductor wafers are transported and handled in small sealed containers, which deliver good contaminant particle results, while providing an industry standard interface between the base of the box and an outboard box load/unload mechanism. Various sealed containers of this type as are known in the art include those taught by Bonora et al (U.S. Pat. No. 4,995,430) and Mortensen et al (U.S. Pat. Nos. 4,709,834 and 4,582,219).

A disadvantage of the SMIF-type box is the need to purchase a special outboard SMIF box load/unload mechanism for each piece of wafer processing equipment with which a SMIF box is to be used. The purpose of such mechanism is to remove the wafers from the SMIF box and to transfer the wafers to and from the processing equipment.

An example of a prior art transfer mechanism is taught by Iwasawa et al (U.S. Pat. No. 4,826,360), in which a transfer vehicle carrying a wafer pod is shuttled through a transfer tube by application of a negative pressure within the tube. Wafer transfer from a sealed environment is also taught by Bonora et al (U.S. Pat. No. 4,995,430) which is discussed above; and by Davis et al (U.S. Pat. No. 5,044,871) in which a nonstandard bell-shaped carrier is maintained under vacuum for wafer transport. In Davis the wafers are carried upside down, which requires that the wafers be processed using unconventional techniques. Both Bonora and Davis place a sealed wafer container in a first chamber which encloses the container. Once the first chamber is sealed and evacuated, the wafer container is opened and the wafer cassette contained therein is transferred to a second chamber. Each wafer is then transferred from the second chamber to a process chamber where the wafer is processed. The wafer is then returned to the wafer cassette and the next wafer is selected and processed, and so on until every wafer in the cassette has been processed.

Thus, typical prior art wafer handling schemes involve two sealed chambers, in addition to the process chamber, each of which contains a substantial volume that must be pumped down during wafer transfer; and they require the use of outboard robot assemblies to hand off a wafer from the unload station to a robot in the process chamber. Accordingly, the teachings of Bonora and Davis provide an outboard load/unload mechanism.

The requirement of an outboard load/unload mechanism means that a relatively large portion of the available clean room area must be provided in front of the associated wafer processing equipment to accommodate both the equipment operator and the load/unload mechanism. In such situation, it may be necessary to increase the total clean room area. Any increase in clean room area adds significant cost per wafer processed. For example, a class 100 installation, which is suitable for older processing technologies, costs about $350.00/0.3 m$^2$ (ft$^2$), while a class 1 installation, which is required for state of the art and emerging technologies, such as for fabricating devices having 0.5 $\mu$m features, costs upwards of $1250.00/0.3 m$^2$ (ft$^2$).

The chamber volumes associated with the SMIF box, the load/unload mechanism, and the load lock chamber of the wafer processing equipment are quite large (in current practice, 60 liters of gas must be pumped and vented for the load lock alone). Such large volumes require considerable pump down time, i.e. the time it takes to physically evacuate gases from the various chambers. These pump down times extend the cycle time of each wafer processed, limiting wafer throughput. The foregoing systems, having large chamber volumes, are also wasteful of expensive processing gases. It is especially important to note that the need for a separate piece of equipment to load wafers between a SMIF-type box and a piece of wafer processing equipment is particularly undesirable because it introduces additional processing time delays associated with the physical movement of the wafers by the load/unload mechanism. Such equipment also requires two sealed surfaces (the SMIF box seal and the processing equipment seal) and therefore is subject to an increased likelihood of introducing contaminant particles into the processing equipment, reducing device yield per wafer; and it adds a complex wafer handling mechanism that is expensive, difficult to align and maintain in alignment, such that proper wafer orientation is not always reliably achieved, and subject to wear and the need for frequent servicing, with its associated equipment (and processing) downtime.

Thus, the present state of SMIF-type box art is not well suited for modern and emerging semiconductor processing technologies as it requires an expensive, complex SMIF box interface mechanism which both exacerbates the likelihood of wafer contamination and creates a wafer throughput bottle neck, while increasing the need for expensive clean room space.

SUMMARY OF THE INVENTION

The present invention is a micro-environment load lock for coupling a SMIF-type box containing a cassette of semiconductor wafers directly to a wafer processing chamber. The load lock includes a load lock chamber, which may include a buffer area in communication with at least one wafer processing chamber, or which may alternatively comprise the processing chamber itself. The load lock also includes a seal operable to accept and sealably couple a SMIF-type box to the load lock chamber, such that the SMIF-type box becomes an extension of the load lock chamber. The load lock provides a base that is selectably operable to open and close the SMIF-type box and to selectably draw a cassette of wafers from the SMIF-type box through a port in communication with the load lock chamber and into the load lock chamber. The base is also operable to seal the port in the absence of a SMIF-type box. A single robot is provided in the buffer area of the load lock chamber for moving one wafer at a time between the cassette of wafers and the process chamber.

BRIEF DESCRIPTION OF THE DRAWINGS

FIG. 1 is a cross sectional view of a sealed container having a standard mechanical interface (SMIF-box) as is known in the art and of the type that may be used in conjunction with the present invention; and FIGS. 2a–2d are cross sectional views showing a micro-environment load lock at various phases of an operating cycle according to the present invention.

DETAILED DESCRIPTION OF THE INVENTION

The present invention is best understood by referring to the Drawings in connection with review of this Description.

The present invention provides a micro-environment load lock in which a semiconductor wafer carrier of electro-polished stainless steel, plastic, or other suitable material, fitted with an industry standard mechanical interface (SMIF-type interface) at its base is received at, and loads directly to, a lift indexer associated with a single or multiple chamber reaction vessel.

A SMIF-type semiconductor wafer carrier 10 of the type known in the prior art is shown in cross section in FIG. 1. Such carriers provide a sealed micro-environment that allows a cassette of semiconductor wafers 18 disposed within the carrier to be transported without the risk of contamination by particulants in the ambient. SMIF-type carriers include an outer surface 11 for maintaining a sealed environment and also typically include a carrying handle 12, an electrostatic shield 14, and a mechanism 16 for securing the contents of the carrier against unwanted movement or shifting during transit.

Although the wafer carrier may be formed from various materials as discussed above, in some embodiments of the invention, e.g. ultra-high vacuum applications, plastic may not be a suitable material from which to form the wafer carrier. In such applications, the preferred material for forming the wafer carrier is stainless steel and other such materials.

In prior art applications, a latch mechanism (not shown) on the carrier 10 secures a carrier base 13 and seals the base to an indexer and wafer transfer mechanism (not shown) having a port plate 22, which is specifically adapted to receive the carrier. The carrier is typically enclosed in a sealed chamber provided by the wafer transfer mechanism. During processing, the enclosing chamber must be evacuated.

A stack of wafers 15 is shown arranged in a wafer cassette 18 disposed within the SMIF-type carrier 10. The wafer cassette 18 is supported by and movably coupled to a carrier door 20. Upon engagement of the SMIF-type carrier with the port plate 22, an associated port door 24 is operable to engage with the carrier door 20 and draw the wafer cassette 18 from the carrier 10 into a second chamber.

In prior art applications, a robot (not shown) within the indexer and wafer transfer mechanism may be operated to transfer each wafer in serial fashion between the carrier 10 and a processing station load lock where another robot is operated to transfer the wafers to a processing chamber. Alternatively, the robot may transfer the entire cassette to a processing station load lock where a second robot is used to individually select and transfer each wafer to and from one or more process chambers.

Once delivered to the processing station load lock, the wafers are introduced into the processing station. Thus, in prior art applications: 1) two external chambers and their associated volumes are required: one to receive the sealed container, and one to receive the wafer cassette; and 2) semiconductor wafers transported within the SMIF-type carrier are handled twice: once by the indexer and wafer transfer mechanism, and thereafter by the transfer mechanism within the processing station load lock.

The present invention involves only one internal volume: that of the wafer carrier itself in combination with that of the load lock chamber. In contrast, the prior art requires the additional volumes discussed above, including a chamber for receiving the sealed container and a much larger load lock chamber (because the entire cassette is transferred into the load lock chamber before each wafer is processed, thus requiring a larger load lock chamber volume).

The diminished volumes inherent in the present invention provide a faster cycle time (pump down and vent) than previously possible. In some embodiments of the present invention, the volumes may be Nitrogen filled to further reduce the pump down times.

Elimination of the external SMIF-type box interface by the present invention also eliminates the cycle time required to transfer each wafer from the wafer cassette, through the external interface transfer mechanism and into the process equipment load lock chamber. That is, wafers are transferred by the present invention directly into the process tool from the wafer carrier.

The present invention couples a wafer carrier directly to a piece of process equipment and thus substantially reduces the introduction of contaminant particles into a process station as may be attributed to the presence of an external indexer wafer transfer mechanism, as well as those attributable to the additional port attendant with the external transfer mechanism.

Any particle contaminants that may be attributable to the presence of the wafer carrier's base in the pumped volume of the load lock chamber may be resolved using an in situ particle monitor. In particular, cycle purge of the lower volume prior to lowering the wafers has been found to eliminate or substantially mitigate any contribution of contaminant particles as may be attributable to the wafer carrier.

FIGS. 2a–2d provide a series a cross sectional views of the present invention at various phases of operation.

In FIG. 2a, a SMIF-type carrier 10 is shown having a wafer cassette 18 disposed within. The present invention is a load lock mechanism 23 which includes a surface 28 adapted to sealably engage with a corresponding SMIF-type carrier surface 13.

It is important to note that the present invention receives a SMIF-type carrier and uses the carrier itself as a first chamber to thereby eliminate the enclosing chamber into which carriers are placed in prior art mechanisms. That is, the carrier in the present invention provides an extension of the load lock chamber and thereby eliminates entirely the need of enclosing the carrier. It is therefore possible to lower a cassette of wafers one at a time, thus consuming only that volume in the load lock chamber necessary to receive that portion of the cassette that is currently being processed, while the remaining portion of the cassette is maintained within the carrier. That is, in the present invention, the carrier and the load lock chamber comprise a single volume that is never larger than the absolute minimum volume necessary to accommodate that portion of the wafer cassette corresponding to the location of the wafer currently being processed. This simplifies operation of the load-/unload mechanism and provides faster system throughput, as well as simplifying system construction and maintenance.

A load lock base 29 seals the lock load mechanism 23. When a wafer carrier 10 is mated to the surface 28 (FIG. 2b), the load lock base 29 engages with the carrier door 20 in such manner as to selectably draw the carrier door into a load lock chamber 25. It is important that the cassette 18 is maintained in rigid alignment with the carrier door 20 such that the cassette is properly indexed during repeated wafer transfers. Accordingly, an H-bar 19 (FIG. 1) is usually provided to locate the cassette to the carrier door and thus maintain the integrity of cassette alignment relative to the carrier door.

Prior art H-bars typically engage with carrier doors that are made of light and flimsy materials. It has been found in the present invention that rugged materials must be employed in the formation of the carrier door portion that mates with the cassette H-bar to assure proper rigidity and repeatability as would not otherwise be possible due to fatigue and warping in lightweight and less enduring materials.

As shown in FIG. 2c, a lift mechanism 31 lowers the load lock door, and thus the wafer cassette 18, through a load lock port 27 to a first wafer position. The load lock chamber is then pumped down using standard slow to fast parameters. Alternatively, the wafer cassette may be slightly lowered and the load lock chamber 25 fast pumped, such that the poor conductance between the internal volumes of the load lock chamber 25 and the wafer carrier 10 act as a slow pump which establishes a pressure differential for drawing the wafers into the load lock chamber.

A single robot assembly 30 disposed within the load lock mechanism is operable to transfer a wafer 15 (FIGS. 2c and 2d) between the wafer cassette 18 and a process chamber 26. In operation, the wafers are transferred to and from the process chamber one at a time. Thus, the cassette is slightly lowered a sufficient distance after a processed wafer is replaced in the wafer cassette, such that the next wafer may be removed from the cassette by the robot. The lift mechanism 31 is thus configured to operate as a wafer indexer, such that lift operation is coordinated with that of the robot.

It is also desirable to maintain wafer orientation during processing. Thus, the robot may include an alignment mechanism or an alignment mechanism may be included within the process chamber. Alignment mechanisms are known in the art and may be of any type as would be suitable for the specific application, e.g. wafer size, etc.

It is understood that the present invention may be provided with any process equipment of the type with which it is desirable to use a SMIF-type carrier. Thus, multiple chamber, as well as single chamber equipment benefit from the present invention, as well as other types of processing equipment as are known in the art to benefit from the use of SMIF-type carriers. For multi-chamber processing equipment, the load lock port 27 may be located in a central location, just above a wafer handling robot, and such that the cassette, when lowered into a central chamber, is surrounded by multiple processing chambers.

Additionally, the present invention is not limited to SMIF-type carrier, but may be used with any sealed micro-environment. The base 28 may be configured as appropriate for mating with any type of micro-environment sealed carrier as is provided. Thus, the base 28 may be an O-ring, a machined surface, etc.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

I claim:

1. A micro-environment load lock for coupling a sealed micro-environment container directly to a process chamber, comprising:
    a load lock chamber in direct communication with at least one process chamber;
    a port in communication with said load lock chamber;
    a seal operable to accept and sealably couple said micro-environment container to said load lock chamber such that said micro-environment container, when opened, has an interior volume which is a sealed extension of said load lock chamber, and has an exterior surface which remains exposed to the ambient;
    a base selectably operable to open and close said micro-environment container and to selectably draw a cassette of wafers from said micro-environment container through said port and into said load lock chamber, and operable to seal said port in the absence of said micro-environment container; wherein said base is operable to apply a pressure differential to said micro-environment container for drawing said cassette of wafers into said load lock chamber;
    a lift indexer for coordinating operation of said base and said robot to effect transfer of said one wafer at a time between said cassette of wafers and said process chamber; and
    a single robot for moving one wafer at a time between said cassette of wafers and said process chamber.

2. The load lock of claim 1, wherein said carrier and said load lock chamber comprise a single variable volume equal to a minimum volume necessary to accommodate that portion of said wafer cassette corresponding to a wafer location currently being processed.

3. A process for coupling a sealed micro-environment container directly to a process chamber, comprising the steps of:
    accepting and sealably coupling said micro-environment container to a load lock chamber such that an interior volume of said micro-environment container becomes an extension of said load lock chamber, and such that an exterior surface of said micro-environment chamber remains exposed to the ambient;

selectably opening and closing said micro-environment container;

alternatively sealing said port in the absence of said micro-environment container;

applying a pressure differential at a base of said micro,environment container to selectably drawing a cassette of wafers from said micro-environment container through a port and into said load lock chamber;

coordinating said wafer drawing step with said wafer moving step to effect transfer of said one wafer at a time between said cassette of wafers and said process chamber; and moving one wafer at a time, through the action of a single robot, between said cassette of wafers and said process chamber.

4. The process of claim 3, wherein, by drawing said cassette of wafers into said load lock chamber, said carrier and said load lock chamber comprise a single variable volume equal to a minimum volume necessary to accommodate that portion of said wafer cassette corresponding to a wafer location currently being processed.

* * * * *